(12) United States Patent
Shin et al.

(10) Patent No.: US 7,829,977 B2
(45) Date of Patent: Nov. 9, 2010

(54) LOW TEMPERATURE CO-FIRED CERAMICS SUBSTRATE AND SEMICONDUCTOR PACKAGE

(75) Inventors: Hyun-Ok Shin, Paju-Si (KR); Sung-Hun Choi, Paju-Si (KR); Sang-Yun Lee, Paju-Si (KR)

(73) Assignee: Advanced Semiconductor Engineering, Inc., Kaoshiung (TW)

( * ) Notice: Subject to any disclaimer, the term of this patent is extended or adjusted under 35 U.S.C. 154(b) by 335 days.

(21) Appl. No.: 11/940,961

(22) Filed: Nov. 15, 2007

(65) Prior Publication Data
US 2009/0127699 A1    May 21, 2009

(51) Int. Cl.
*H01L 29/06* (2006.01)
(52) U.S. Cl. .................. 257/622; 257/E21.553; 257/700; 257/730; 361/760; 361/768
(58) Field of Classification Search .......... 257/E23.009, 257/700, 730, 734, 778, 698, 690; 361/760, 361/736, 768; 174/260, 261
See application file for complete search history.

(56) References Cited

U.S. PATENT DOCUMENTS

| | | | | |
|---|---|---|---|---|
| 4,437,141 A * | 3/1984 | Prokop | ...................... | 361/771 |
| 5,334,857 A * | 8/1994 | Mennitt et al. | ................. | 257/48 |
| 5,729,437 A * | 3/1998 | Hashimoto | .................. | 361/760 |
| 5,731,709 A * | 3/1998 | Pastore et al. | ................ | 324/760 |
| 6,144,090 A * | 11/2000 | Higashiguchi | ............... | 257/693 |
| 6,278,178 B1 * | 8/2001 | Kwon et al. | .................. | 257/684 |
| 6,388,264 B1 * | 5/2002 | Pace | ......................... | 250/551 |
| 6,418,030 B1 * | 7/2002 | Yamaguchi et al. | ......... | 361/760 |
| 6,724,083 B2 * | 4/2004 | Ohuchi et al. | ............... | 257/734 |
| 6,759,940 B2 * | 7/2004 | Mazzochette | ............. | 338/22 R |
| 6,862,190 B2 * | 3/2005 | Olzak et al. | ................. | 361/768 |

* cited by examiner

*Primary Examiner*—Chris Chu
(74) *Attorney, Agent, or Firm*—Birch, Stewart, Kolasch & Birch, LLP (57) ABSTRACT

A low-temperature co-fired ceramics (LTCC) substrate includes a plurality of substrate units and at least one cutting pattern. The cutting pattern is disposed between neighboring two of the substrate units. A semiconductor package including the LTCC substrate is also disclosed.

5 Claims, 10 Drawing Sheets

LOW TEMPERATURE CO-FIRED CERAMICS SUBSTRATE AND SEMICONDUCTOR PACKAGE

BACKGROUND OF THE INVENTION

1. Field of Invention

The invention relates to a low-temperature co-fired ceramics (LTCC) substrate having a cutting pattern and a semiconductor package including the LTCC substrate.

2. Related Art

With the progress of the technology, the current electronic products have become more miniature and thinner. Taking a mobile phone in the wireless communication industry as an example, the size of the mobile phone is reduced from that of the earliest mobile phone used in the Advance Mobile Phone System (AMPS) to that smaller than one palm. Meanwhile, the function of the mobile phone is developed from the simplest audio transmission to the data, picture and text transmission. Consequently, the key point and the trend in designing the electronic product include the light, thin, short and small properties, and the LTCC technology can satisfy these requirements.

The LTCC technology has the ability of integrating active devices, modules and passive devices together. In the LTCC technology, a plurality of LTCC substrates is stacked, and the passive devices or integrated circuits (ICs) are embedded into the LTCC substrate. In addition, the LTCC substrate may be advantageously co-fired with the metal having the low impedance and the low dielectric loss, and the passive devices, such as inductors and capacitors, can be advantageously embedded without the limitation of the number of layers. Therefore, the LTCC substrate is very suitable for the application to an integrated device. In addition, the LTCC technology can reduce the size of the electronic product and lower the cost thereof and achieve the object of making the electronic product be light, thin, short and small.

However, the LTCC substrate has a high-hardness layer and the crumbly property. Thus, when a cutting machine is cutting a harder substrate, a larger friction force between the substrate and a cutting blade is generated, and the stress generated by the friction is transferred to the cutting blade. As a result, the electronic product or the cutting blade may be damaged and the manufacturing yield is deteriorated. Thus, it is an important subject to generate a lower resistant force and thus to enhance the yield when the ceramics substrate is being cut.

SUMMARY OF THE INVENTION

In view of the foregoing, the invention is to provide a LTCC substrate capable of enhancing the production yield and a semiconductor package including the LTCC substrate.

To achieve the above, the invention discloses a LTCC substrate including a plurality of substrate units and at least one cutting pattern. The cutting pattern is disposed between neighboring two of the substrate units.

To achieve the above, the invention further discloses a semiconductor package including a substrate unit, an electronic unit and an encapsulant. The substrate unit has a side surface formed with a cutting pattern. The electrical unit is disposed on a surface of the substrate unit. The encapsulant is disposed on the substrate unit and covers the electronic unit.

As mentioned above, the semiconductor package and the LTCC substrate according to the invention have the following advantages. Because the cutting pattern is formed on the LTCC substrate, the generated friction stress is smaller when the cutting apparatus is cutting the LTCC substrate. Thus, the possibility of damaging the ceramics substrate is decreased, so that the production yield can be enhanced and the production cost can be decreased.

BRIEF DESCRIPTION OF THE DRAWINGS

The invention will become more fully understood from the detailed description and accompanying drawings, which are given for illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1:
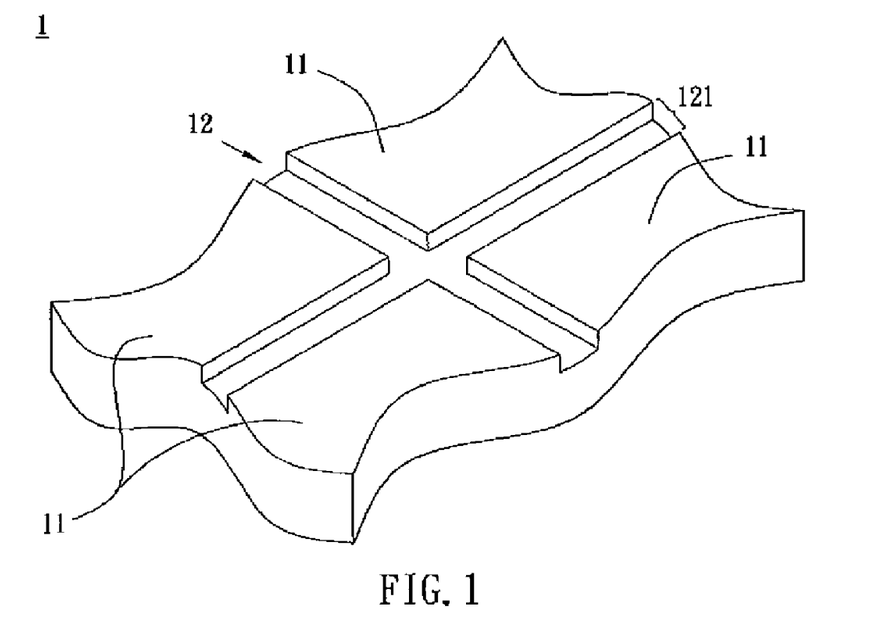
FIGS. 1 to 4 are schematic illustrations showing a LTCC substrate according to a preferred embodiment of the invention.

Referring to FIG. 1, a LTCC substrate 1 according to a preferred embodiment of the invention includes a plurality of substrate units 11 and at least one cutting pattern 12. In this embodiment, four substrate units 11 are provided. However, the number of the substrate units 11 is not particularly restricted, and the user can increase or decrease the number of the substrate units 11 according to the requirement.

Figure 2:
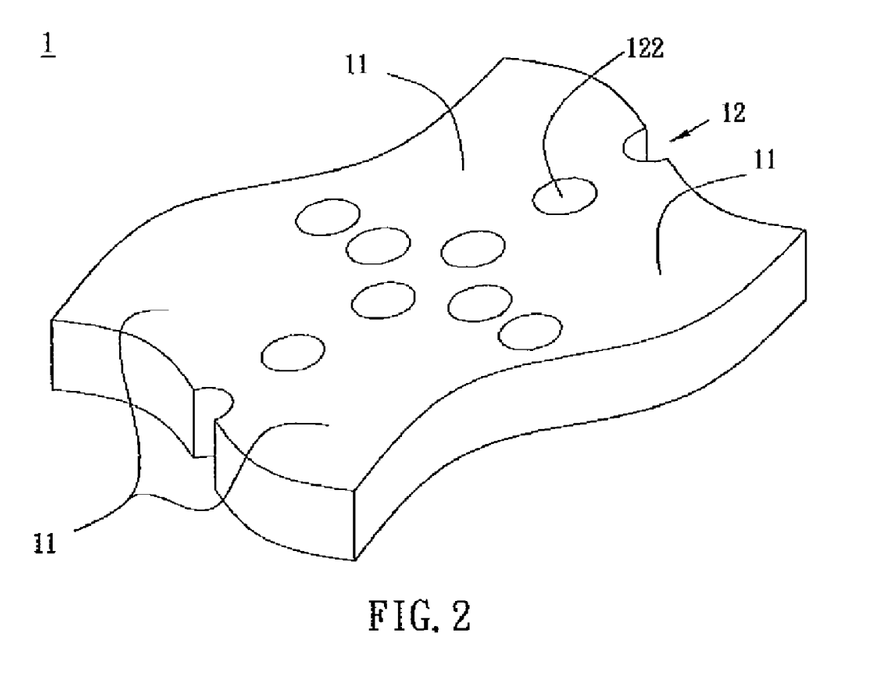
Figure 3:
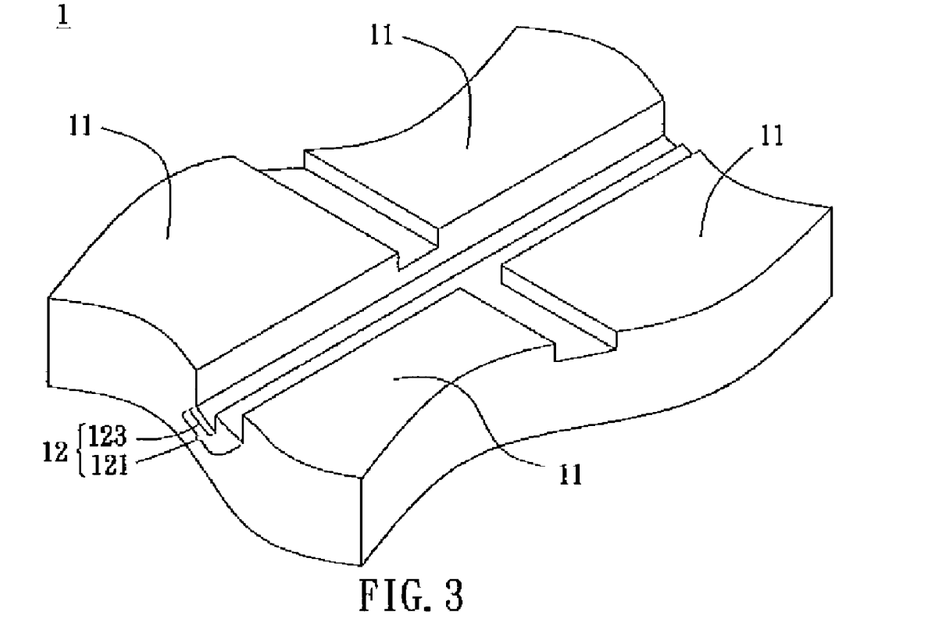
Figure 4:
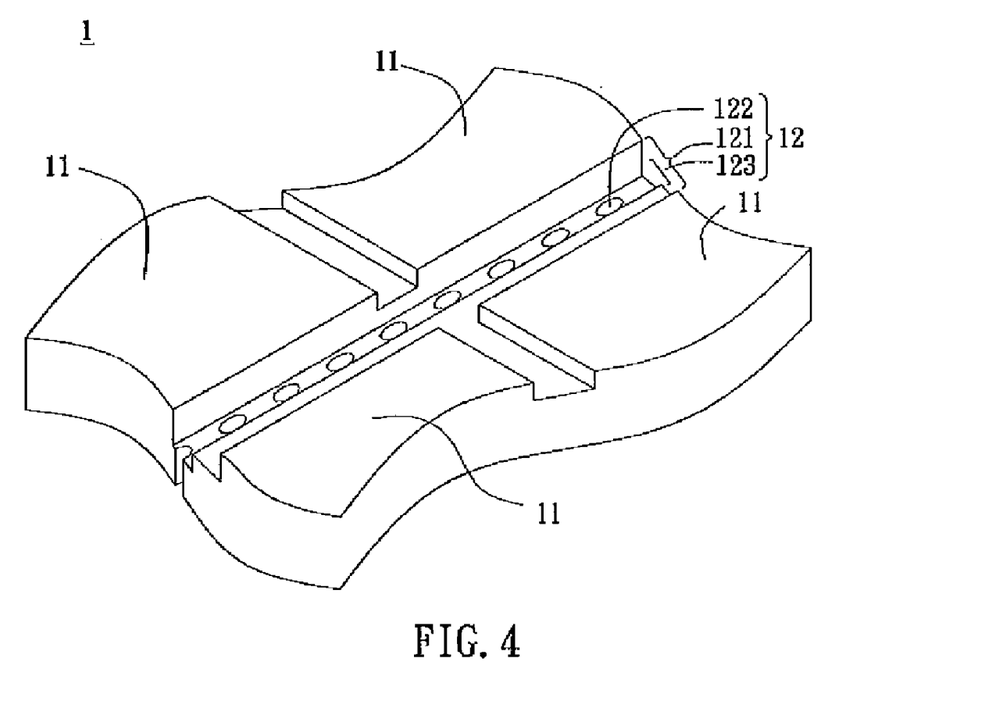

The cutting pattern 12 is disposed between neighboring two of the substrate units 11 so that a cutting apparatus can perform a cutting operation along the cutting pattern 12. The cutting pattern 12 may be a groove 121, as shown in FIG. 1, may have a plurality of holes 122, as shown in FIG. 2, or may have a groove 121 and a cutting path 123, as shown in FIG. 3. Of course, the cutting pattern 12 has a groove 121, holes 122 and a cutting path 123, as shown in FIG. 4, in order to make the cutting apparatus cut the substrate easily, to reduce the friction stress generated during the cutting process, and to decrease the possibility of damaging the ceramics substrate.

In this embodiment, the shape of each of the holes 122 may be an elliptic shape, a circular shape or a polygonal (rectangular or triangular) shape. Herein, the shape of each hole 122 is the elliptic shape, for example.

Figure 5:
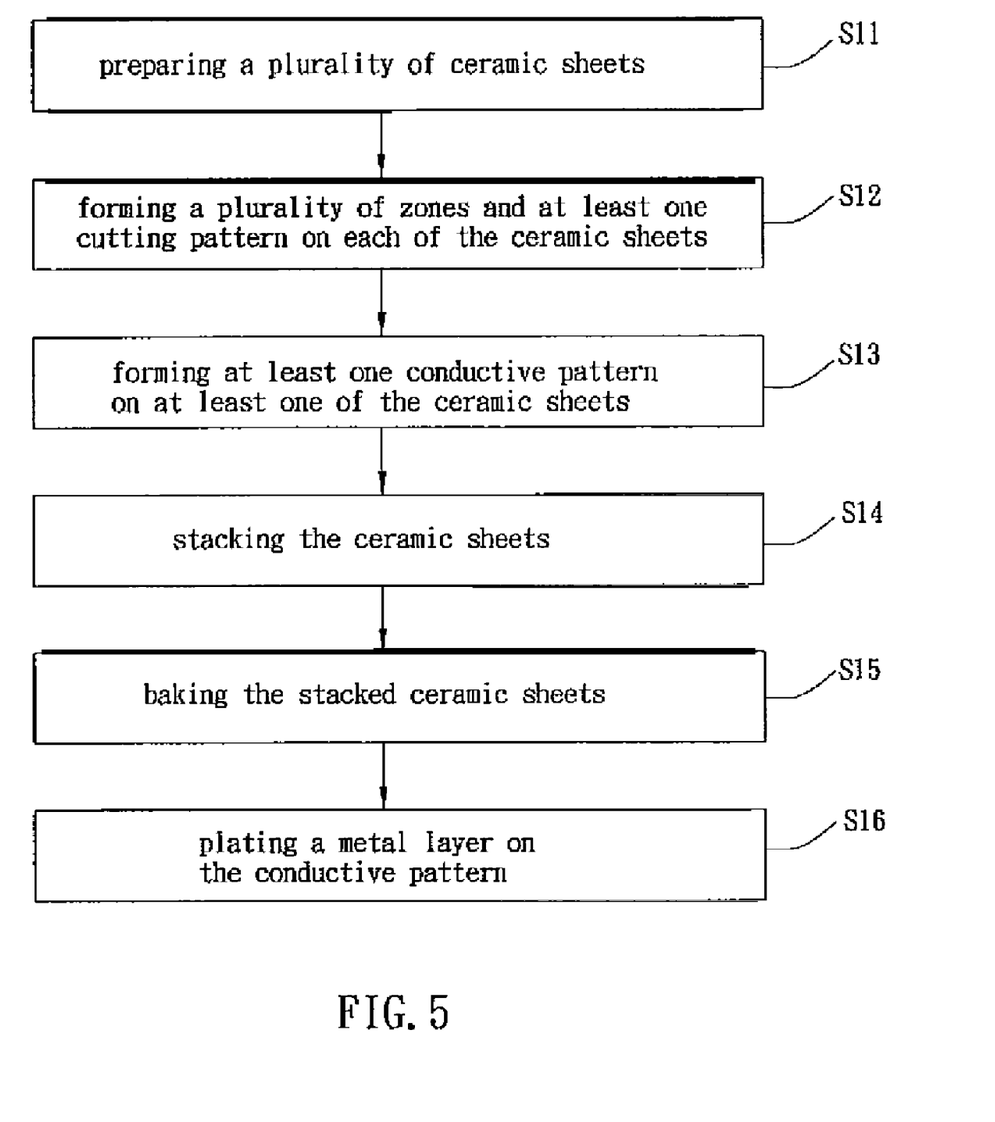
FIG. 5 is a flow chart showing a manufacturing method of the LTCC substrate according to the preferred embodiment of the invention.

Referring to FIG. 5, a method of manufacturing the LTCC substrate according to the preferred embodiment of the invention includes steps S11 to S16. Illustrations will be made by taking FIG. 5 in conjunction with FIGS. 6A to 6E.

Figure 6A:
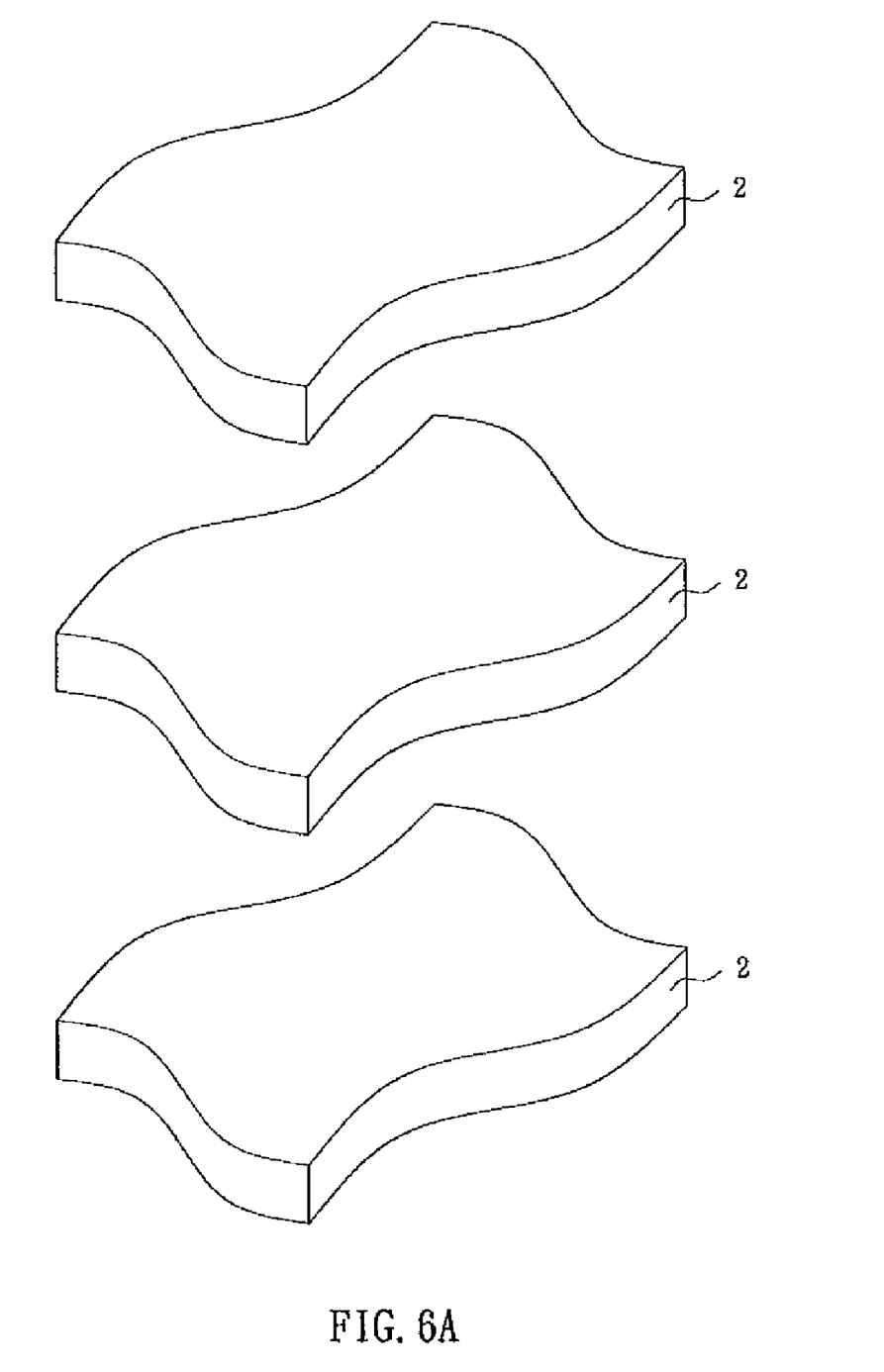
FIGS. 6A to 6E are schematic illustrations showing structures in conjunction with the flow chart of FIG. 5.
Figure 6B:
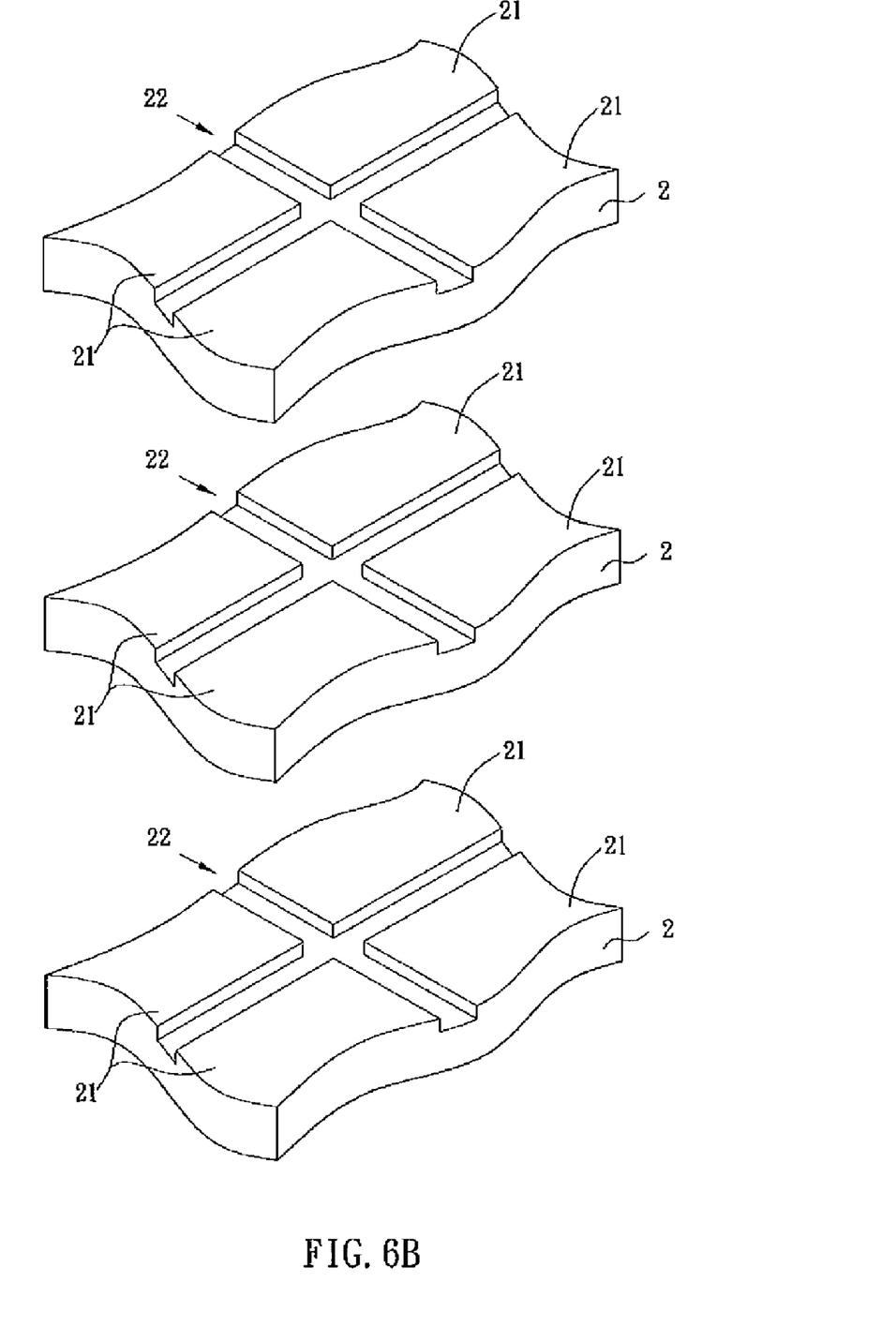

As shown in FIG. 6A, a plurality of ceramic sheets 2 is prepared in step S11. As shown in FIG. 6B, a plurality of zones 21 and at least one cutting pattern 22 are formed on each of the ceramic sheets 2 in step S12, wherein the cutting pattern 22 is formed between neighboring two of the zones 21.

In this embodiment, the cutting pattern 22 having at least one groove is formed, by the cutting apparatus, on each of the ceramic sheets 2 so that four zones 21 are defined. Herein, the number of the zones 21 is not particularly restricted to four, and the user can increase or decrease the number of the zones 21 according to his/her requirement. In addition, the cutting pattern 22 may also include a plurality of holes punched by a punching apparatus on the ceramic sheets 2. Furthermore, the cutting pattern 22 has various aspects. When the cutting pattern 22 has the grooves and the holes simultaneously, the cutting apparatus is adopted to form the grooves on the ceramic sheets 2 and then the punching apparatus is adopted to form the holes in each of the grooves. Of course, the order of forming the grooves and the holes may also be adjusted. The aspects of the cutting pattern 22 may include those of the cutting patterns 12, as shown in FIGS. 1 to 4. Herein, the cutting pattern 22 of this embodiment is a groove, for example.

Figure 6C:
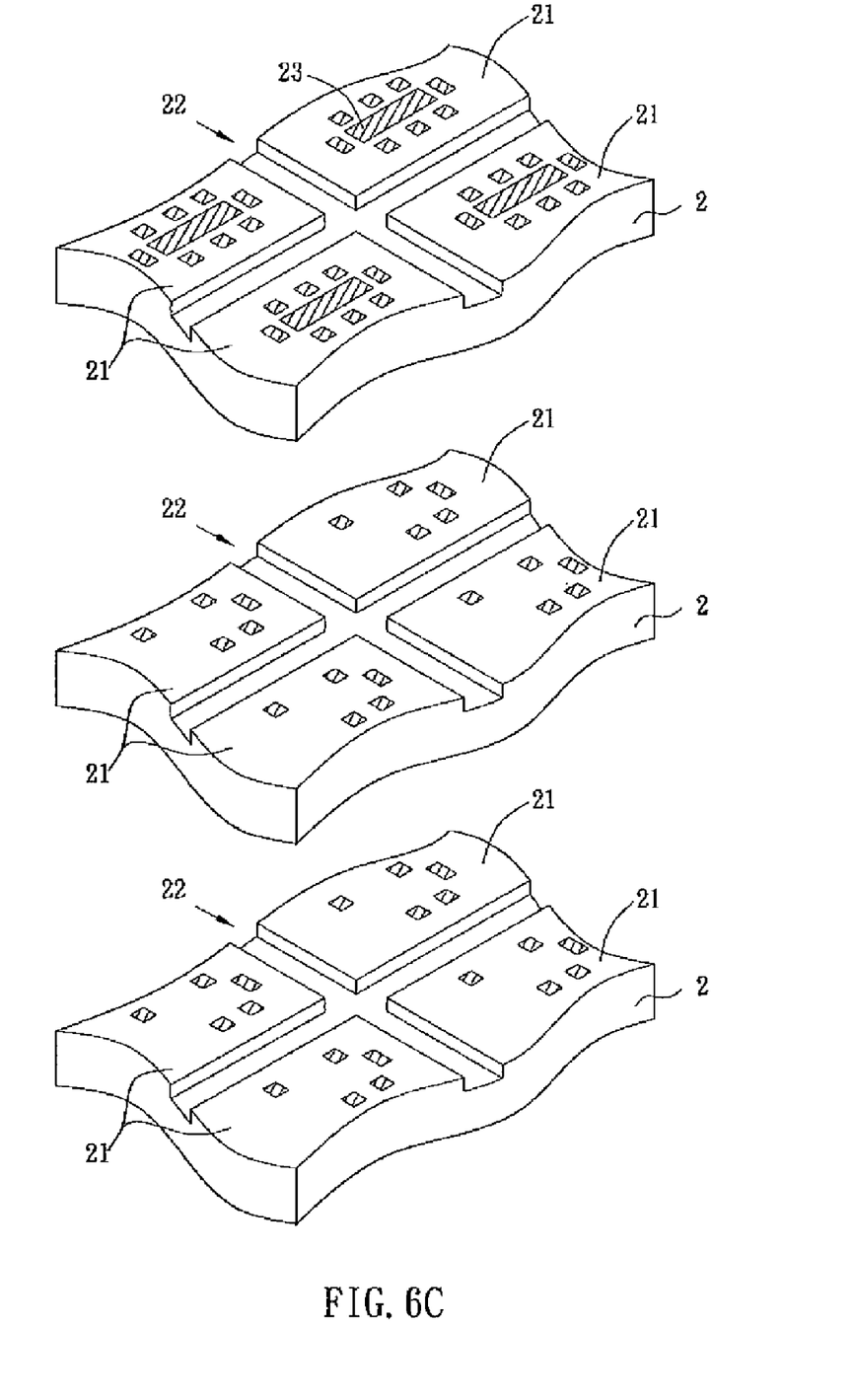

As shown in FIG. 6C, at least one conductive pattern 23 is formed on at least one of the ceramic sheets 2 in step S13. In this embodiment, the conductive pattern 23 is formed on a surface of the uppermost ceramics sheet 2.

Figure 6D:
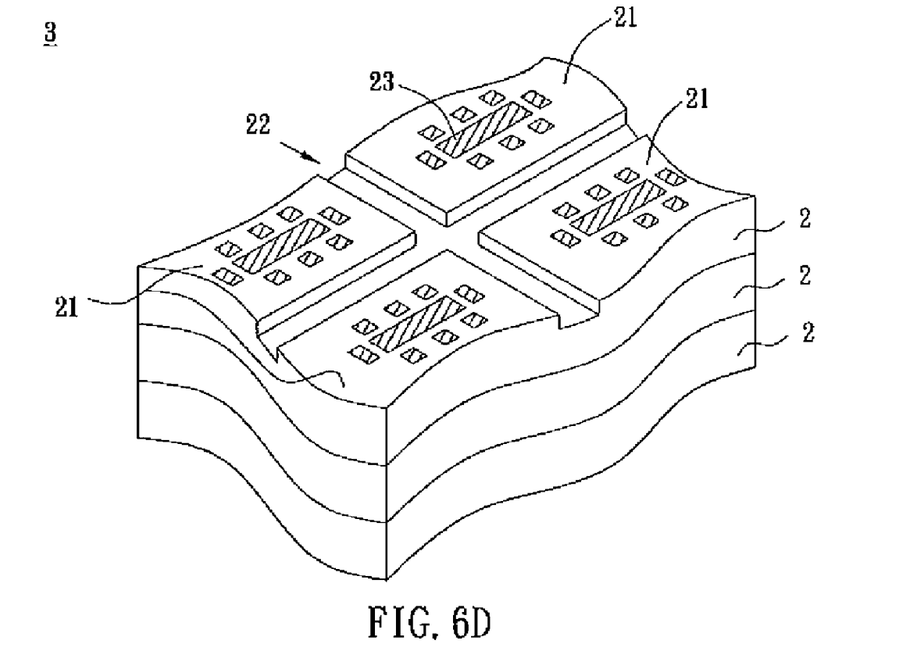
Figure 6E:
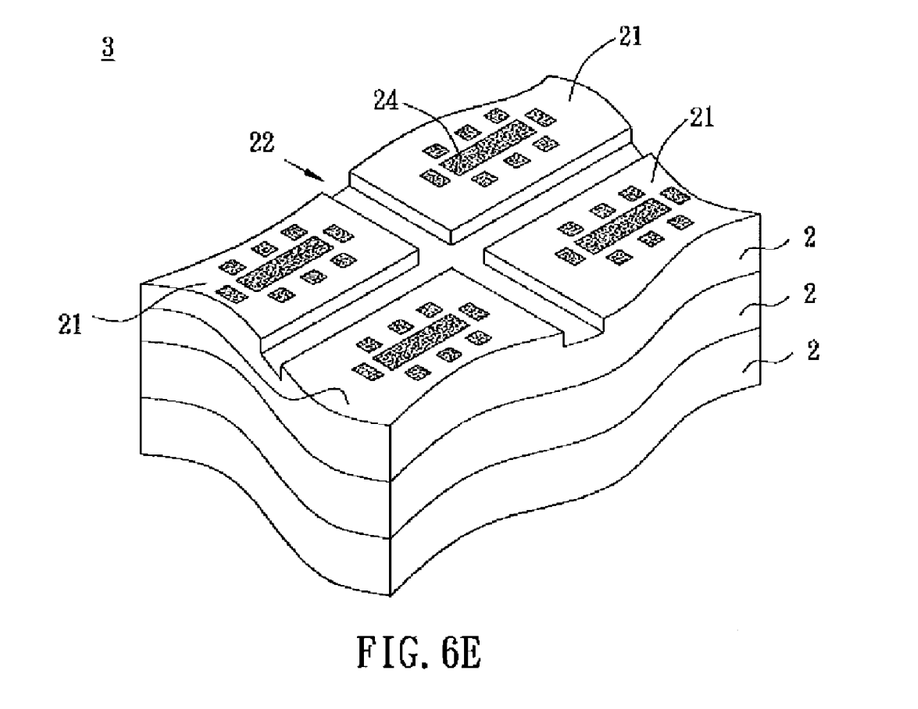

As shown in FIG. 6D, the ceramic sheets 2 are stacked in step S14. In step S15, the stacked ceramic sheets 2 are baked to form a LTCC substrate 3, As shown in FIG. 6E, a metal layer 24 is plated on the conductive pattern 23 in step S16, wherein the material of the metal layer includes nickel/gold.

In addition, the user may use the cutting apparatus to cut the LTCC substrate 3 along the cutting pattern 22 into the substrate units 21. Because the LTCC substrate 3 of the invention has the cutting pattern 22, the friction stress generated between the cutting tool and the LTCC substrate 3 is smaller when the cutting apparatus is cutting the LTCC substrate 3. Thus, the LTCC substrate 3 cannot be easily broken, and the production yield can be enhanced.

It is to be noted that the order of the above-mentioned steps is not particularly restricted, and may be adjusted according to the requirement on the manufacturing process.

Figure 7:
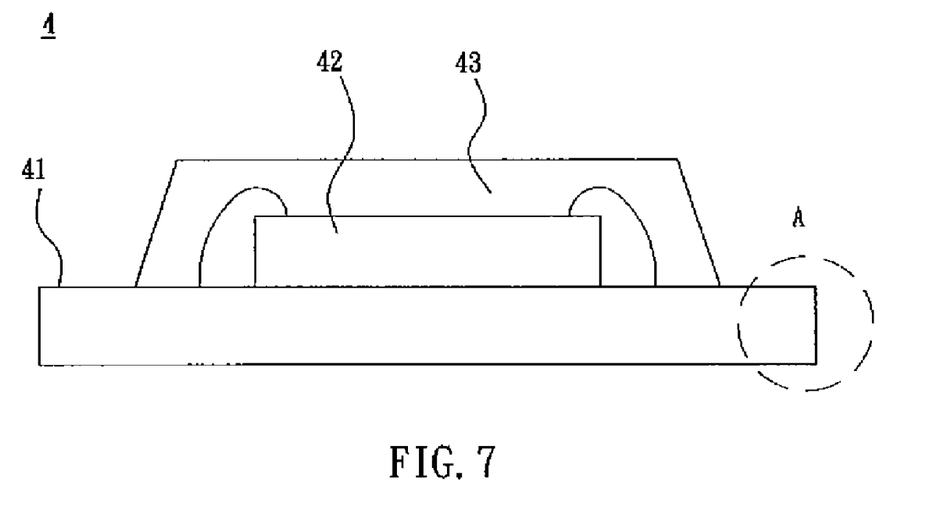
FIG. 7 is a schematic illustration showing a semiconductor package according to the preferred embodiment of the invention.

Referring to FIG. 7, a semiconductor package 4 according to the preferred embodiment of the invention includes a substrate unit 41, an electronic unit 42 and an encapsulant 43.

The electronic unit 42 is disposed on a surface of the substrate unit 41 and is electrically connected to the substrate unit 41 by way of wire bonding in this embodiment, or by way of flip chip bonding or surface mounting in another embodiment. The encapsulant 43 is disposed on the substrate unit 41 and covers the electronic unit 42. The electronic unit 42 may be an active chip or an integrated passive device.

According to the method of manufacturing the LTCC substrate, it is to be noted that the side surface of the substrate unit 41 of this embodiment has a cutting type because the LTCC substrate has a cutting pattern.

Figure 8:
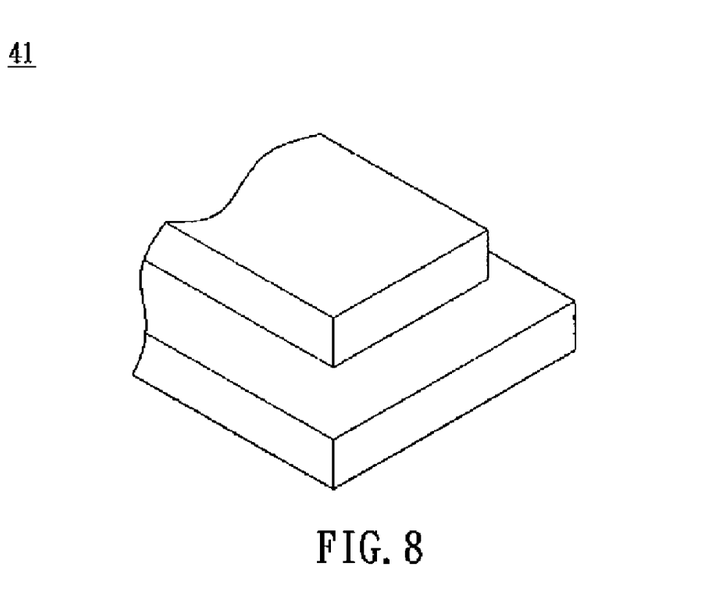
FIGS. 8 to 12 are schematic illustrations showing cutting patterns for the semiconductor package.
Figure 9:
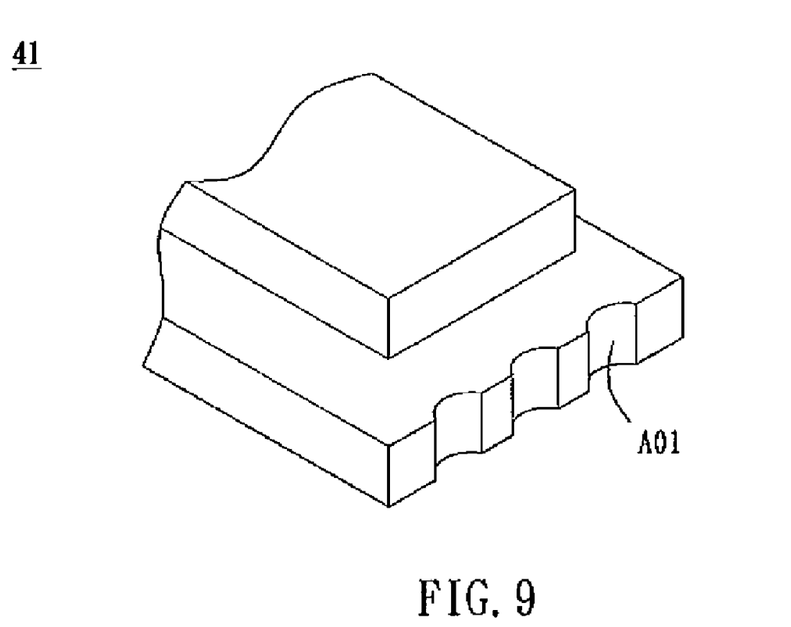
Figure 10:
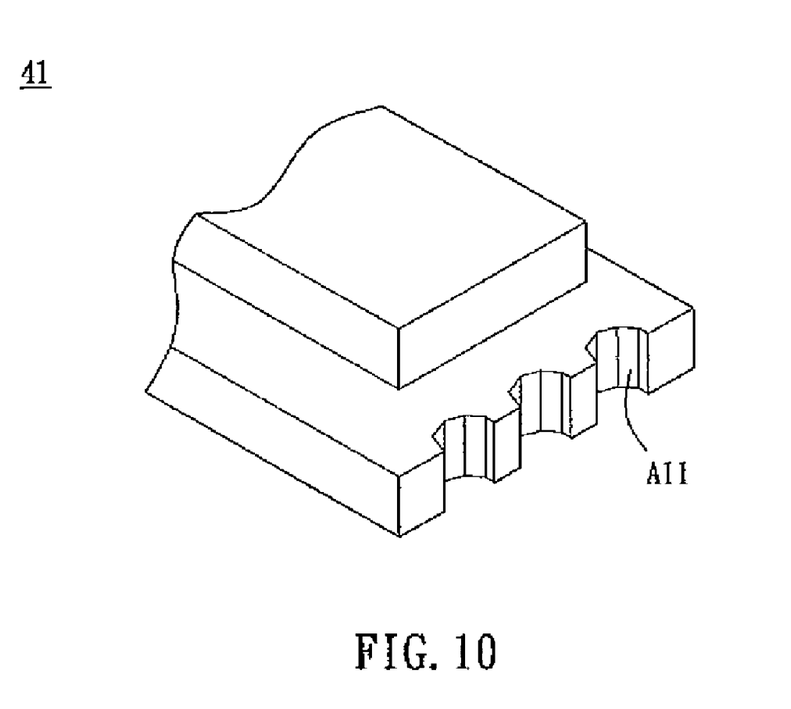

The cutting patterns will be illustrated with reference to FIGS. 8 to 12, which are enlarged views showing the zone A of FIG. 7. When the cutting apparatus is cutting the LTCC substrate, the width of the cutting tool is smaller than the width of the groove. So, the cutting pattern on the side surface of each substrate unit 41 has a step-shaped structure, as shown in FIG. 8, when the LTCC substrate is cut into a plurality of substrate units 41. Alternatively, as shown in FIG. 9, the cutting pattern on the side surface of the substrate unit 41 has a step-shaped structure and a plurality of elliptic curved surfaces A01. Alternatively, as shown in FIG. 10, the cutting pattern on the side surface of the substrate unit 41 has a step-shaped structure and a plurality of polygonal curved surfaces A11.

Figure 11:
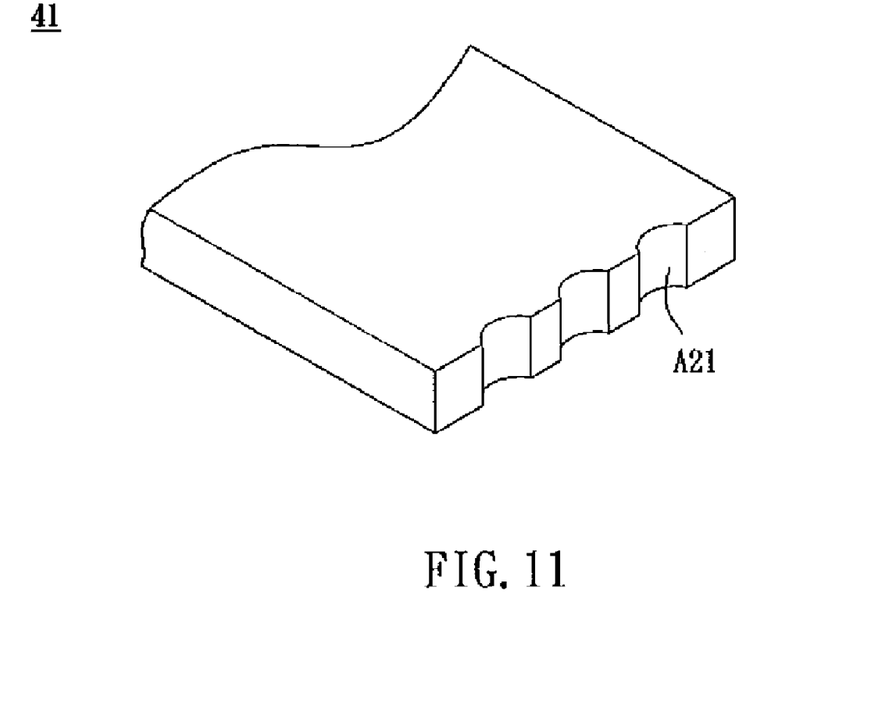
Figure 12:
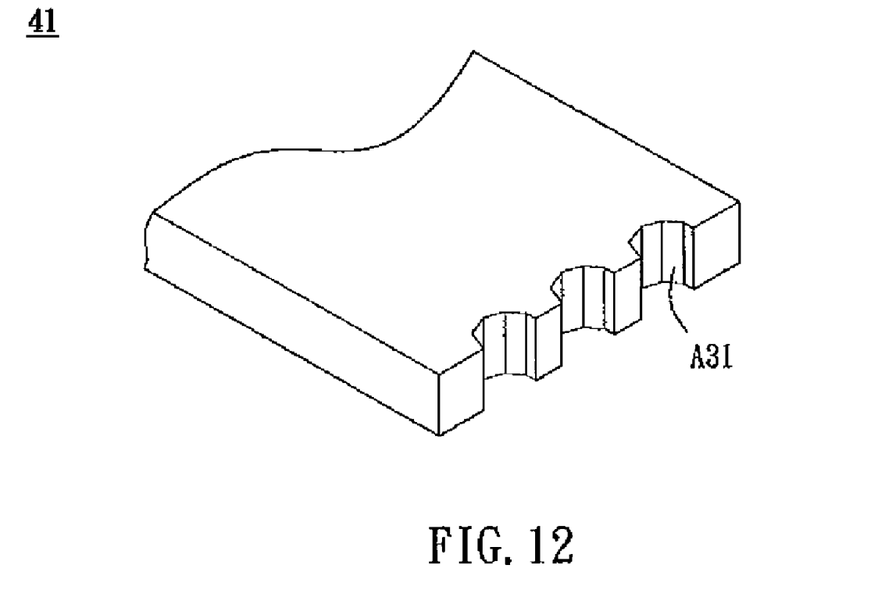

Of course, if the precision of the cutting apparatus is higher or the substrate unit 41 is processed after being cut, the side surface thereof does not have the step-shaped structure. As shown in FIG. 11, the cutting pattern formed on the side surface of the substrate unit 41 includes a plurality of elliptic curved surfaces A21. Alternatively, as shown in FIG. 12, the cutting pattern formed on the side surface of the substrate unit 41 includes a plurality of polygonal curved surfaces A31.

In summary, the semiconductor package and the LTCC substrate according to the invention have the following advantages. Because the cutting pattern is formed on the LTCC substrate, the generated friction stress is smaller when the cutting apparatus is cutting the LTCC substrate. Thus, the possibility of damaging the ceramics substrate is decreased, so that the production yield can be enhanced, and the production cost can be decreased.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A semiconductor package, comprising:
   a substrate unit having a side surface formed with a cutting pattern;
   an electronic unit disposed on a surface of the substrate unit and electrically connected to the substrate unit; and
   an encapsulant disposed on the substrate unit and covering the electronic unit,
   wherein the cutting pattern has a step-shaped structure with at least two steps.

2. The semiconductor package according to claim 1, wherein one side surface of the step-shaped structure comprises a plurality of curved surfaces.

3. The semiconductor package according to claim 2, wherein each of the curved surfaces comprises an elliptic curved surface or a polygonal curved surface.

4. The semiconductor package according to claim 1, wherein the electrical unit is electrically connected to the substrate unit through flip chip bonding, wire bonding or surface mounting.

5. The semiconductor package according to claim 1, wherein the substrate unit is a low-temperature co-fired ceramics (LTCC) substrate.

* * * * *